United States Patent

Sawyer

Patent Number: 5,378,997
Date of Patent: Jan. 3, 1995

[54] LOW NOISE AMPLIFIER WITH CAPACITIVE FEEDBACK

[75] Inventor: David A. Sawyer, Swindon, England

[73] Assignee: Plessey Semiconductors Limited, Wiltshire, United Kingdom

[21] Appl. No.: 139,436

[22] Filed: Oct. 20, 1993

[30] Foreign Application Priority Data

Oct. 26, 1992 [GB] United Kingdom ............. 9222449

[51] Int. Cl.⁶ .................. H03F 3/45; H03F 3/191
[52] U.S. Cl. ........................... 330/260; 330/294
[58] Field of Search ............ 330/260, 294, 252, 302, 330/303, 305, 306

[56] References Cited

U.S. PATENT DOCUMENTS

| | | | |
|---|---|---|---|
| 4,287,477 | 9/1981 | Carlsen, III | 330/260 |
| 4,878,033 | 10/1989 | Wong | 330/277 |
| 5,045,807 | 9/1991 | Ishihara | 330/260 |
| 5,117,203 | 5/1992 | Tennyson | 330/294 |
| 5,172,076 | 12/1992 | Brown | 330/260 |

FOREIGN PATENT DOCUMENTS

| | | |
|---|---|---|
| 0355670 | 2/1990 | European Pat. Off. . |
| 1147926 | 4/1969 | United Kingdom . |
| 1241285 | 8/1971 | United Kingdom . |
| 2225502 | 5/1990 | United Kingdom . |

Primary Examiner—Steven Mottola
Assistant Examiner—Tiep H. Nguyen
Attorney, Agent, or Firm—Kirschstein Ottinger Israel & Schiffmiller

[57] ABSTRACT

An amplifier comprising an emitter-coupled pair of transistors having inductive load impedances, with capacitive feedback elements tuned with the inductive loads and the capacitive input of the following stage to be resonant at the range of frequencies to be amplified. The reactive loads and feedback elements introduce less noise than with resistive components.

3 Claims, 1 Drawing Sheet

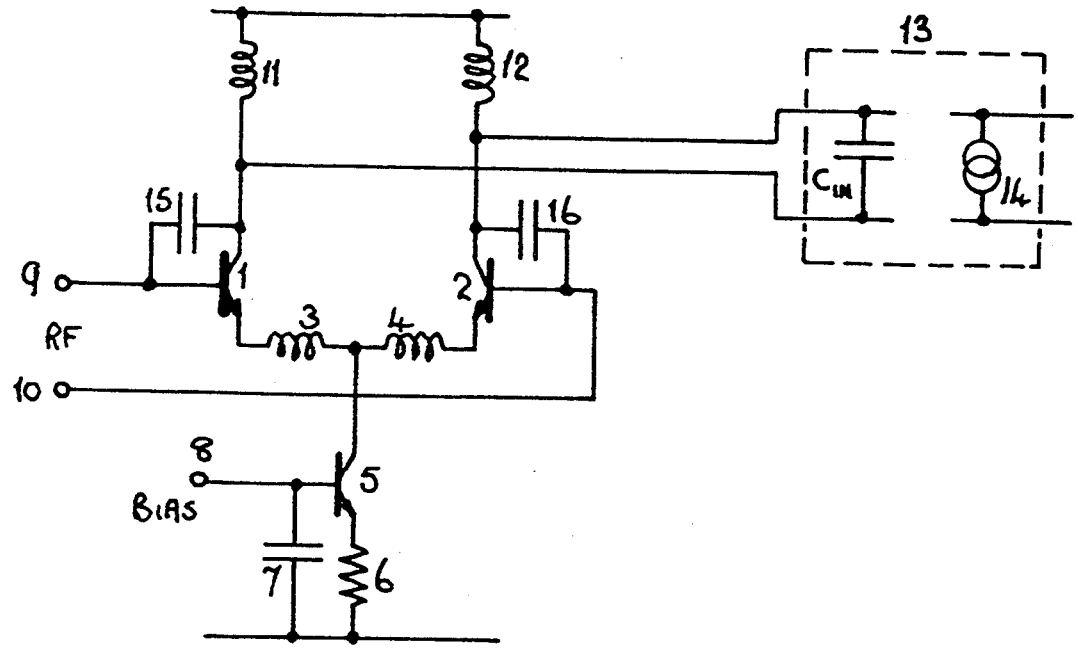

LOW NOISE AMPLIFIER WITH CAPACITIVE FEEDBACK

BACKGROUND OF THE INVENTION

Field of the Invention

The present invention relates to amplifiers, and in particular although not exclusively to low-noise radio frequency amplifiers.

Description of the Related Art

The performance of a radio frequency receiver is limited by two conflicting requirements:
1) The noise level generated in the receiver itself, which dictates the minimum received signal level that will meet a given signal to noise ratio.
2) The ability of the receiver to receive weak signals in the presence of much larger signals at frequencies close to that of the weak signals.

Adjacent channel rejection is conventionally achieved in the IF filters of a receiver, so that any front-end amplifying stage, prior to the first frequency changer, may have to cope with large adjacent-channel signals and at the same time introduce the minimum possible level of noise.

If such front-end amplifying stages were perfectly linear they would be able to cope with any level of adjacent-channel signal. However, in practice, such stages are not perfectly linear, and can give rise to intermodulation products that may fall within the wanted channel, contributing to the noise and interfering with the reception of weak signals in the wanted channel. Such amplifier stages are also limited by the maximum signal level that can be handled without compression or clipping occurring.

Conventional methods of improving the linearity of front-end amplifying stages involve the use of series and shunt feedback together with as much open-loop gain as can be generated without exceeding acceptable limits of stability and while retaining a suitable time domain response. The feedback is usually effected by way of resistors, which add noise to the amplifier and result in a degraded noise figure. The effect can be minimised by using small values of resistance, but this then requires high power levels if the advantages of linearity and large signal handling are to be retained.

SUMMARY OF THE INVENTION

According to one aspect of the present invention a low noise amplifier stage is provided with capacitive feedback, the value of capacitance at the output of said amplifier stage, including that presented by said capacitive feedback, being tuned with inductive load means to be substantially resonant at the range of frequencies to be amplified.

According to another aspect of the present invention a low noise transistor amplifier stage comprises a junction transistor having inductive collector load means and capacitive feedback means connected between output and input circuits thereof, the value of capacitance at the output of said amplifier stage, including that presented by said capacitive feedback, being substantially resonant with said inductive load means at the range of frequencies to be amplified.

According to another aspect of the present invention a differential input/differential output amplifier stage comprises a pair of junction transistors having their emitter electrodes connected to a common current source by way of respective inductive impedance elements and their collector electrodes connected to respective inductive loads, and respective capacitive feedback means connecting the collector circuits of said transistors to their respective base circuits, the values of capacitance at the outputs of said amplifier stage, including that presented by said feedback means, being arranged to be substantially resonant with said inductive loads at the range of frequencies to be amplified.

BRIEF DESCRIPTION OF THE DRAWING

A low-noise radio frequency amplifier stage in accordance with the present invention will now be described by way of example with reference to the accompanying drawing, which shows the amplifier stage diagrammatically.

DETAILED DESCRIPTION OF THE PREFERRED EMBODIMENT

Referring to the drawing, the amplifier stage comprises a pair of NPN junction transistors 1 and 2 the emitter electrodes of which are connected by way of respective inductive elements 3 and 4 to a common current source comprising a transistor 5, resistor 6 and capacitor 7, the value of current provided by said source being dependent upon the value of a bias signal applied to a terminal 8. Radio frequency input signals are applied by way of input terminals 9 and 10 to the base electrodes of the transistors 1 and 2, and output signals developed across inductive collector load impedances 11 and 12 are applied to a following stage 13 represented as a capacitive input impedance $C_{IN}$ and a current source 14. Capacitors 15 and 16 provide feedback from the collector circuits of the transistors 1 and 2 to their base circuits.

The use of reactive components rather than resistive components to provide the feedback introduces much less noise and consequently little increase in the noise figure over that associated with the transistors themselves. The values of the reactive components are chosen so that the capacitances at the collector electrodes of the transistors 1 and 2, including the capacitance values presented by the capacitors 15 and 16, the collector capacitances of the transistors 1 and 2 and the input capacitance $C_{IN}$ of the following stage 13, are arranged to be resonant with the inductive load impedances 11 and 12 at the range of frequencies to be amplified.

The phase shifts introduced by the capacitors 15 and 16 and the inductive elements 3 and 4 are arranged to cancel, so that the input impedance presented at the terminals 9 and 10 is almost entirely resistive, and it is possible to define a low standing wave ratio real input impedance.

The dominant parasitics of the transistors 1 and 2, the collector-base capacitances, are effectively in parallel with the respective capacitors 15 and 16 and are tuned out. At the same time the tuning of the output circuit with the capacitive input impedance of the following stage 13 achieves optimum power matching. The circuit therefore enables accurate input and output power matching, low noise figure and large signal handing with minimum power consumption.

I claim:
1. A differential input/differential output amplifier stage for amplifying signals over a range of frequencies, comprising: a pair of junction transistors, each transistor having emitter, base and collector electrodes; a current source; means including respective inductive impedance elements connecting the emitter electrodes of said pair of transistors to said current source; means connecting the collector electrodes of said pair of transistors to respective inductive loads; connecting means including respective capacitive feedback means for connecting the collector electrode of each of said pair of transistors to the base electrode of the respective transistor; and output circuit means connected to the collector electrodes of said pair of transistors and presenting a reactive impedance at said collector electrodes, said output circuit means, said capacitive feedback means and said inductive loads together being substantially resonant over said range of frequencies.

2. A differential input/differential output amplifier stage in accordance with claim 1, wherein said current source comprises a further junction transistor.

3. A differential input/differential output amplifier stage in accordance with claim 1, wherein said output circuit means of said amplifier stage includes an input circuit of a following stage.

* * * * *